United States Patent [19]
Hom et al.

[11] Patent Number: 6,079,040
[45] Date of Patent: Jun. 20, 2000

[54] MODULE LEVEL SCAN TESTING

[75] Inventors: Pat Y. Hom, Milpitas; T. Dean Skelton, San Jose, both of Calif.

[73] Assignee: Chips & Technologies, Inc., San Jose, Calif.

[21] Appl. No.: 08/711,114

[22] Filed: Sep. 9, 1996

[51] Int. Cl.[7] .................................................. G06F 11/00
[52] U.S. Cl. ........................................................... 714/738
[58] Field of Search ............................... 371/27.1, 22.31, 371/22.32, 22.34, 22.1, 27.5; 395/183.06

[56] References Cited

U.S. PATENT DOCUMENTS

| | | | |
|---|---|---|---|
| 4,215,406 | 7/1980 | Gumola et al. | 364/468 |
| 4,215,407 | 7/1980 | Gumola et al. | 364/468 |
| 4,216,528 | 8/1980 | Robertson | 364/468 |
| 4,220,917 | 9/1980 | McMahon, Jr. | 324/73 R |
| 4,241,307 | 12/1980 | Hong | 324/73 R |
| 4,745,355 | 5/1988 | Eichelberger et al. | 324/73 R |
| 4,799,164 | 1/1989 | Hellekson et al. | 235/467 |
| 4,854,039 | 8/1989 | Wendt | 29/832 |
| 4,897,838 | 1/1990 | Tateishi | 372/22.3 |
| 5,042,034 | 8/1991 | Correale, Jr. et al. | 371/22.3 |
| 5,329,533 | 7/1994 | Lin | 371/22.3 |
| 5,369,645 | 11/1994 | Pritchard et al. | 371/22.1 |
| 5,424,655 | 6/1995 | Chua | 326/40 |
| 5,448,575 | 9/1995 | Hashizume | 371/22.3 |
| 5,459,735 | 10/1995 | Narimatsu | 371/22.3 |
| 5,477,167 | 12/1995 | Chua | 326/41 |

OTHER PUBLICATIONS

Williams, Thomas W., et al., "Design for Testability—A Survey", Proceedings of the IEEE, vol., 71, No. 1, Jan. 1983, pp. 98–112.

*Primary Examiner*—Vincent P. Canney
*Attorney, Agent, or Firm*—D'Alessandro & Ritchie

[57] ABSTRACT

A design of logic circuitry to be tested is divided into one or more discrete logic modules usable in other designs of circuitry. An automated test pattern generator (ATPG) program and its tools are applied to the discrete module while not also being applied to the remainder of the logic circuitry, with the result that an ATPG pattern is provided for the module. When the module is reused in another design of logic circuitry, the ATPG pattern is also reusable in such other design.

13 Claims, 2 Drawing Sheets

MODULE LEVEL SCAN TESTING

BACKGROUND OF THE INVENTION

The present invention relates to the testing of integrated circuitry and, more particularly, to the scan testing of integrated circuitry grouped in modules capable of being used in other integrated circuitry.

The integrated circuitry on a chip is commonly tested. This testing may be associated with design analysis. Moreover, production chips of an integrated circuit design are checked for manufacturing flaws before being furnished to a customer.

The above checking includes applying a test program to the circuitry to determine if logic on the chip will react as desired to various electrical inputs.

The test program may include one or more scan patterns to be applied to the specimen of the circuit to be tested. Scan patterns can typically detect more manufacturing flaws than manually generated test patterns. Scan patterns are usable only on circuits which include particular logic for scanning. These special circuits are called "scanned circuits". In a scanned circuit, some or all of the flip-flops are replaced with scan flip-flops. Additional scan support logic may also be present. A scan flip-flop typically has two modes: a normal operation mode, and a scan test mode. The scan flip-flops and the scan support logic provide an additional method of controlling and observing the circuits' internal values.

A scan pattern includes one or more test sequences which, in turn, include one or more "scan operations". A scan operation is a set of input stimulus which loads specified values into the scan flip-flops (a scan-in operation), or extracts expected values from the scan flip-flops (a scan-out operation). Note that scan-in and scan-out operations can occur simultaneously. During a scan operation, the scan flip-flops are placed into scan test mode, values are loaded and/or extracted from the scan flip-flops, then the scan flip-flops are placed back into normal operation mode. A typical test sequence in a scan pattern consists of a scan-in operation, a set of input stimulus (with the scan flip-flops in normal operation mode), and a scan-out operation.

Each of the scan patterns making up a test program is formed by applying an ATPG (Automated Test Pattern Generation) program and tools to an integrated circuit design having scan flip-flops to develop ATPG patterns. The ATPG program takes advantage of the presence of the scan flip-flops by loading desired values into the scan flip-flops or by specifying expected values that should be extracted from such scan flip-flops. A translator program converts the ATPG pattern into a scan pattern designed for the circuitry to be tested.

In the basic implementation of scan, a design is tested as one entity, and the design's scan flip-flops are interconnected into a single, long shift register (a scan chain). Values are loaded and/or extracted from the scan flip-flops by serially shifting in/out one bit per clock cycle. (Loading a scan chain of 800 scan flip-flops requires 800 clock cycles.) Because such serial scan testing is relatively time consuming, many of those in the art have divided a design's scan flip-flops into numerous scan chains. Loading eight scan chains of 100 scan flip-flops each, requires 100 clock cycles as opposed to 800 clock cycles. The ATPG program is still run on the entire design; the resulting ATPG patterns are translated to support multiple scan chains. In other words, the scan patterns in both of the above scenarios, the more efficient approach just described and the basic approach, are generated on a chip-level basis. That is, the original ATPG pattern and its tools are applied to the full piece of integrated circuitry rather than to selected parts of the same.

New ATPG patterns are required whenever the logic changes, especially if scan flip-flops are added and deleted from the design. Moreover, generating compact, high coverage ATPG patterns often requires multiple runs with different tool constraints and options. The scan patterns developed from an ATPG arrangement also must be debugged. This debugging typically is a long process because of (not infrequent) mismatches between the circuit design's behavior and the ATPG tools zero-delay simulations.

SUMMARY OF THE INVENTION

The present invention provides for the development and use of ATPG patterns for those individual parts of a specimen of circuitry design that find use in other circuitry designs. As the logic is reused in different circuit designs, the ATPG patterns for such logic can also be reused.

From the broad standpoint the invention includes several steps for the development of input stimulus values for performing scan operations on a design of logic circuitry. The first step is separating from the design a discrete logic module usable in other designs of logic circuitry. If the design to be tested has more than one module which is so usable in other circuitry, the design is divided into multiple modules. The method includes thereafter applying an ATPG program and its tools to the module while not applying the same to the remainder of the circuitry. Again, if the design has more than one module of logic usable separately in other logic designs, the ATPG program and its tools is applied separately to each of the modules while not being applied to the others.

Specific scan patterns for the reusable modules of the circuitry are then prepared from the reusable ATPG patterns. (Note that unlike the scan patterns, the ATPG patterns are not dependent on the specific circuitry within which the particular reusable module is incorporated.) As mentioned previously, it is common for a test program to include a multiple number of test sequences and, hence, scan operations. From the broad standpoint each test sequence includes loading components of a module under test with predetermined values (a scan-in operation), applying input stimulus values to the module, and thereafter evaluating the response (a scan-out operation). The step of applying includes, most desirably, replacing with controlled inputs, the input to the selected module which otherwise would be provided by other aspects of the integrated circuitry, with known inputs.

The invention includes not only methods as described above, but also apparatus for performing the same.

Other features and advantages of the invention either will become apparent or will be described in connection with the following, more detailed description of a preferred embodiment of the invention and variations.

BRIEF DESCRIPTION OF THE DRAWING

With reference to the accompanying drawing.

DETAILED DESCRIPTION OF THE PREFERRED EMBODIMENT

The following relatively detailed description is provided to satisfy the patent statutes. It will be appreciated by those skilled in the art that various changes and modifications can be made without departing from the invention.

Figure 1:
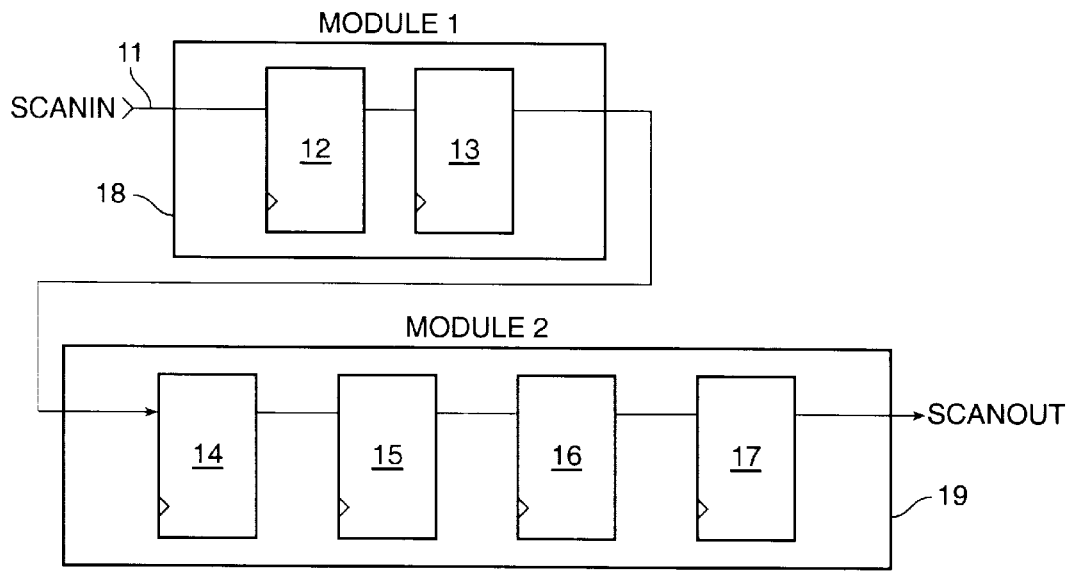
FIG. 1 is a schematic diagram of a prior art arrangement.

The prior art arrangement of FIG. 1 is included for illustrative purposes. It shows, in simplified form, a scan chain as it may be commonly developed to test integrated circuitry design. The scan test pattern is developed by applying one or more ATPG (automated testing pattern generator) programs and their various tools to the entire integrated circuitry. The circuitry to be tested is represented by two modules. These two modules have logic which includes the six scan flip-flops 12–17 connected in a scan chain as shown. (Only the scan chain is shown, not other circuitry such as combinatorial logic and non-scanned flip-flops. Moreover, the clock and other inputs to the individual scan flip-flops are not shown. Interconnections between modules also are not shown. It should be noted that it is typical for the output of logic components of the circuitry to be fed to other logic in the circuit and vice versa. Thus, the behavior of individual modules is often dependent on outputs from other modules.)

In some instances integrated circuitry to be tested might be made up of modules as is indicated by modules 18 and 19. However, since the logic of both modules are in the same scan chain, it is impossible to distinguish the reaction of one module from that of others. That is, while modules of integrated circuitry may or may not include scan circuitry, the scan flip-flops of one module cannot be loaded without affecting the values loaded or extracted from the scan flip-flops of the other. As stated before, the output from one module affects the output of the others. Therefore, in the development of the values to be loaded into the flip-flops, ATPG patterns are produced based on the logic of the full integrated circuitry, rather than the specific logic of the individual modules.

While in order to speed up scanning operations some have divided integrated circuitry into a number of scan chains, none have devised a scheme for the discrete scanning of those logic modules that may be usable in other integrated circuitry. It is not as simple to do as might first appear, because of the major interdependence between the scan flip-flops irrespective of the module in which they are in, the outputs of the individual modules, etc., as discussed above. Thus, in the past these multiple scan chains are used by ATPG programs applied to the full circuitry. Therefore, in the past one module of the integrated circuitry to be tested has not been isolated from the remainder of such circuitry logic for the generation of ATPG patterns and the resulting scan patterns.

Figure 2:
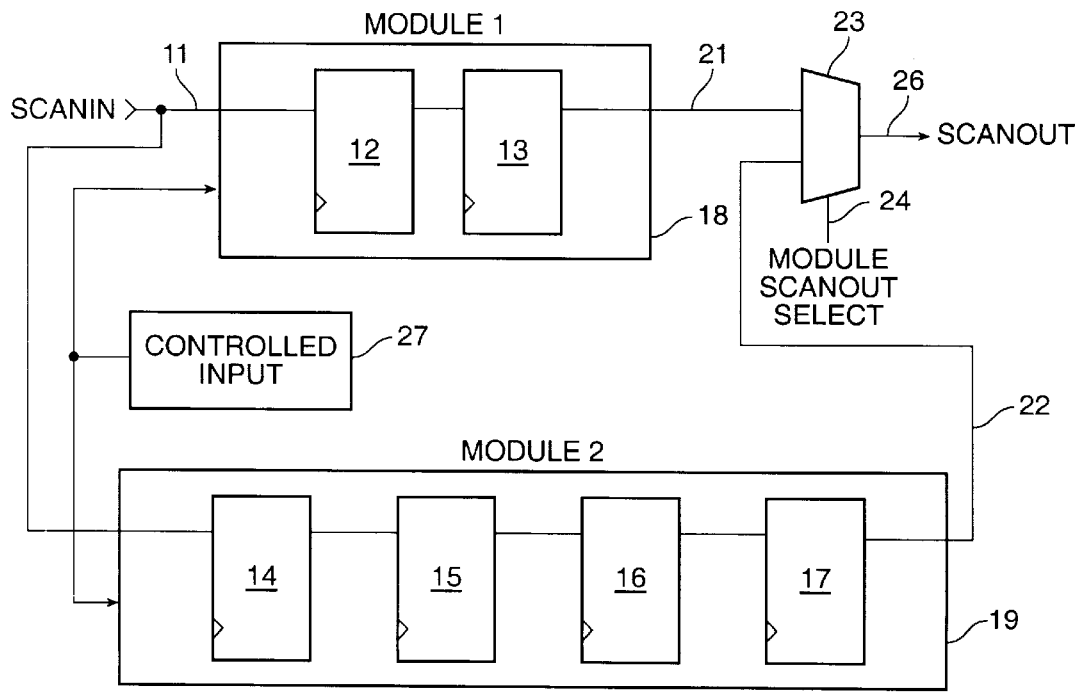
FIG. 2 is a schematic diagram of a preferred embodiment of the invention.

A preferred embodiment of the invention is illustrated in FIG. 2. (For convenience in understanding, the same reference numerals are used in FIG. 2 as in FIG. 1 where applicable.) With this simplified embodiment even though a single ATPG program is utilized, it is applied separately to the two modules to develop separate ATPG patterns for the individual modules. The resulting two ATPG patterns are then used to prepare separate scan patterns for the two modules. These scan patterns will be dependent on the specific circuitry using the modules even though the ATPG patterns are not.

Each of the two modules then can be separately scanned, and the SCANOUT values are module specific. That is, while as is illustrated the SCANIN signal on line 11 is directed both to the logic of module 1 and to the logic of module 2, the separate outputs from the modules are, as represented by lines 21 and 22, directed to separate inputs of a multiplexer 23. A signal on a "MODULE SCANOUT SELECT" input 24 selects one of the two inputs of the multiplexer 23 to appear on the output as "SCANOUT" values. This is represented in FIG. 2 by output 26.

One problem in dividing a circuitry into various modules and applying an ATPG pattern to such modules separately is that in most situations a module to be scanned will have inputs from other integrated circuitry in the full design. As one aspect of the invention these inputs are replaced by controlled, known inputs. The hardware providing this input is represented in FIG. 2 by block 27. As is illustrated, its output is directed to both of the modules. It should be noted that while for simplicity in illustration the same inputs are provided to both of the modules, as a practical matter in most situations the controlled inputs to each of the modules will be different. Moreover, there will be some of such controlled inputs which will be common to all of the modules whereas other might be module specific.

Figure 3:
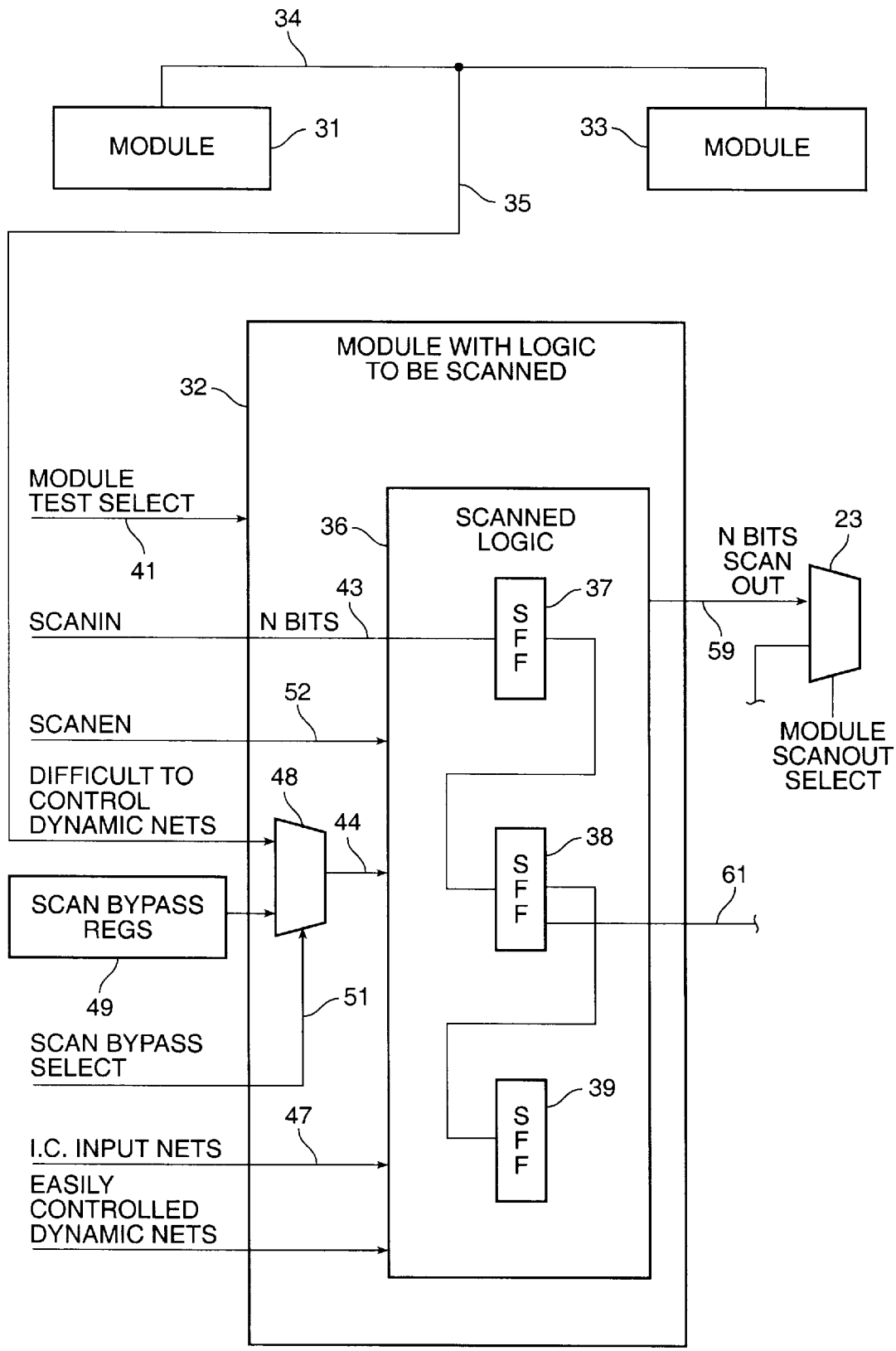
FIG. 3 is a more detailed schematic diagram portion of the preferred embodiment of FIG. 2.

Reference is made to FIG. 3 for a more detailed description. The circuitry is divided into modules usable in other integrated circuitry designs. (There may be other circuitry in the integrated circuitry which neither is tested nor is part of a module usable in other designs.) Three modules, modules 31, 32 and 33, are shown in the drawing as representative. It is to be noted that these modules and various logic components in the same are all connected together logically. This is represented by lines 34 and 35. While the modules into which integrated circuitry is divided may or may not include scan circuitry, in this instance one of such modules, module 32, does and aspects of it relevant to the invention are shown in some detail. These details will be used to describe not only parts of the invention, but its use. In this connection the logic to be scanned, includes scanned flip-flops (labeled SFF) is identified in FIG. 3 by sub-block 36. To simplify the description only three SFFs are shown, numbered 37, 38 and 39.

Module 32 includes simple logic for indicating its selection to be tested. This is represented in the figure by the "MODULE TEST SELECT" input 41. A scan-en input 52 switches the scan flip-flops between normal operation and the scan test mode. The actual scan-in of values of the flip-flops is represented by input line 43, whereas the scan-out of values is represented by the line referred to by the reference numeral 59. These lines are shown as N bits wide because the scan flip-flops may be connected in one or more scan chains.

The input to module 32 provided by logic of the other modules is referred to in the field as dynamic nets (as opposed to static, unchanging, nets). Normally, if an ATPG program is run only on this module (as opposed to being run on the entire integrated circuit), these dynamic nets must be considered uncontrolled inputs to the ATPG program. Insofar as the invention is concerned, most of such dynamic nets are divided between easy to control ones and difficult to control ones. Easily controlled dynamic nets are the outputs of easy to load flip-flops and/or latches in other modules. The loading of these flip-flops/latches must not affect the state of the flip-flops/latches in the module 32. The ability to be easily loaded (without affecting the state of flip-flops/latches in module 32) may have been part of the normal operation of the chip, or this capability may have been added to support module level scan.

The remaining dynamic nets are considered difficult to control. (Note that the module inputs which are connected to the IC's inputs, shown by line 47, are considered controllable inputs.) Most of them are directed to one input of a multiplexer (MUX) 48 used to distinguish between the module input and the input from scan bypass registers represented at 49. (It may be desirable for cost or similar reasons to allow some of the dynamic nets to be uncontrolled.) These scan bypass registers provide controlled information during actual scan testing. They are provided in accordance with the invention to support module level scan testing by assuring that some dynamic nets will always be controllable. Any implementation is appropriate as long as the loading of such scan bypass registers does not change the state of module 32's scanned logic flip-flops/latches.

A scan bypass select signal as is represented at 51 is directed to MUX 48 for controlling which of its two input signals appear at its output represented at 44. During normal operation of the integrated circuitry, the data provided by the dynamic nets appear at the MUX output whereas during a scan test sequence, the data provided by the scan bypass registers appears on its output.

As mentioned at the beginning of the detailed description, applicant is not limited to the specific embodiment and variations described above. The claims, their equivalents and their equivalent language define the scope of protection.

What is claimed is:

1. In developing scan patterns for a design of logic circuitry, the steps of:
   (A) separating from said design a discrete logic module which is usable in other designs of logic circuitry;
   (B) applying an automated test pattern generator (ATPG) program and automated test pattern generator tools to said module while not applying the same to the remainder of said logic circuitry; and
   (C) translating the pattern output of said automated test pattern generator into input stimulus values to be applied to said module.

2. The method of claim 1 including the further steps of applying said input stimulus values to logic of said module, and thereafter evaluating the response of said logic to said input stimulus values.

3. The method of claim 1 wherein said design of logic circuitry includes a plurality of said modules of logic circuitry usable in other designs and wherein said step of separating includes dividing said design into at least two of said discrete logic modules; and said step of applying includes applying an automated test pattern generator and automated test pattern generator tools to a first one of said two modules while not applying the same to the second one thereof, and applying an automated test pattern generator and automated test pattern generator tools to said second one of said modules while not also applying the same to said first module.

4. The method of claim 3 wherein said step of applying includes replacing with known information input, the potential input to the selected module from other modules of said circuitry design.

5. The method of claim 3 further including the steps of applying input stimulus to logic of said plurality of modules and thereafter evaluating the separate response of each of said modules to said input stimulus values.

6. In the testing of a specimen of logic circuitry believed to conform to a logic design, the steps of:
   (A) dividing said design into a plurality of discrete logic modules usable separately in other logic designs;
   (B) loading predetermined values in portions of the logic of a selected one of said modules embodied in said specimen;
   (C) developing input stimuli for said logic of said selected module;
   (D) applying said input stimuli to said selected module; and
   (E) evaluating the response of said selected module to said input stimuli.

7. The method of claim 6 wherein said step of developing includes the steps of applying an automated test pattern generator and automated test pattern generator tools to a first one of said modules while not applying the same to a second one thereof; and applying an automated test pattern generator and automated test pattern generator tools to a second one of said modules while not also applying the same to said first module.

8. The method of claim 6 wherein said step of developing includes replacing with controlled input, the potential input to the selected module from other modules of said specimen of integrated circuitry.

9. In the testing of a design of logic circuitry, the steps of:
   (A) separating from said design a discrete logic module which is usable in other designs of logic circuitry;
   (B) applying an automated test pattern generator (ATPG) program and automated test pattern generator tools to said module while not applying the same to the remainder of said logic module to develop an ATPG pattern for said module; and
   (C) reusing both said module and said ATPG pattern in another design of logic circuitry.

10. The method of claim 9 wherein said step of reusing includes the step of developing from said ATPG pattern, a scan pattern which is specific to the other design of logic circuitry.

11. Apparatus for testing specimens of a design of circuitry having at least one discrete module of logic usable in another design of circuitry, comprising:
    means for developing test patterns for only the logic of said module;
    means for applying said test patterns to said module; and
    means for evaluating the response of said module to said patterns separate and apart from the remainder of said discrete circuitry modules.

12. The apparatus of claim 11 wherein said means for applying includes means for selecting the input to said selected module to be said input stimuli defined by said test patterns.

13. The apparatus of claim 11 wherein said logic of said module includes scan flip-flops and said test patterns are scan patterns.

* * * * *